US011086235B2

United States Patent
Bolder et al.

(10) Patent No.: US 11,086,235 B2
(45) Date of Patent: Aug. 10, 2021

(54) MOTOR, DUAL STROKE STAGE AND LITHOGRAPHIC APPARATUS

(71) Applicant: ASML Netherlands B.V., Veldhoven (NL)

(72) Inventors: Joost Johan Bolder, Waalre (NL); Peter Michel Silvester Maria Heijmans, Weert (NL); Jeroen Van Duivenbode, Veldhoven (NL); Ruud Hubertus Silvester Vrenken, Heythuysen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/756,629

(22) PCT Filed: Sep. 5, 2018

(86) PCT No.: PCT/EP2018/073792
§ 371 (c)(1),
(2) Date: Apr. 16, 2020

(87) PCT Pub. No.: WO2019/076525
PCT Pub. Date: Apr. 25, 2019

(65) Prior Publication Data
US 2020/0326636 A1    Oct. 15, 2020

(30) Foreign Application Priority Data

Oct. 17, 2017   (EP) .................................... 17196860
Mar. 8, 2018    (EP) .................................... 18160692

(51) Int. Cl.
*G03F 7/20*  (2006.01)
*H02P 25/064*  (2016.01)
(Continued)

(52) U.S. Cl.
CPC .......... *G03F 7/70758* (2013.01); *G03F 7/705* (2013.01); *G03F 7/709* (2013.01);
(Continued)

(58) Field of Classification Search
CPC ............. G03F 7/70716; G03F 7/70358; G03F 7/70691; G03F 7/70783; G03F 7/70766;
(Continued)

(56) References Cited

U.S. PATENT DOCUMENTS 5,796,231 A    8/1998   Kyodo
5,914,829 A    6/1999   Kadlec et al.
(Continued)

FOREIGN PATENT DOCUMENTS

JP     H08312715 A   11/1996
JP     H11164586 A    6/1999
(Continued)

OTHER PUBLICATIONS

International Search Report and Written Opinion of the International Searching Authority directed to related International Patent Application No. PCT/EP2018/073792, dated Dec. 21, 2018; 13 pages.
(Continued)

*Primary Examiner* — Christina A Riddle
(74) *Attorney, Agent, or Firm* — Sterne, Kessler, Goldstein & Fox P.L.L.C.

(57) ABSTRACT

The invention relates to a motor (LD) comprising: a stationary part (STP), comprising: a row of coil assemblies (UCA, LCA), the coil assemblies having multiple phases, a movable part (MP), comprising: a row of permanent magnets (UPM,LPM), wherein the row of coil assemblies has a first length and the row of permanent magnets has a second length, wherein the second length is smaller than the first length, wherein the coil assemblies are arranged to interact
(Continued)

with permanent magnets aligned with the coil assemblies to generate a driving force, a comparator to compare a position measurement signal representative for an actual position of the movable part with a set-point signal representative for a desired position of the movable part to provide an error signal; a motion feedback controller configured to provide a control signal on the basis of the error signal; at least one current amplifier configured to provide an actuation signal to the coil assemblies on the basis of the control signal, wherein the motor comprises a feedforward device, wherein the feedforward device is configured to provide a current amplifier feedforward signal on the basis of the set-point signal, or a derivative thereof, wherein the current amplifier feedforward signal is provided to the at least one current amplifier to compensate for unbalanced back electromotive forces on one or more of the coil assemblies due to the one or more coil assemblies being only partly aligned with the permanent magnets.

19 Claims, 7 Drawing Sheets

(51) Int. Cl.
*H02P 6/00* (2016.01)
*H02K 41/03* (2006.01)
*H02P 6/182* (2016.01)

(52) U.S. Cl.
CPC ...... *G03F 7/70725* (2013.01); *G03F 7/70775* (2013.01); *H02K 41/031* (2013.01); *H02P 6/006* (2013.01); *H02P 6/182* (2013.01); *H02P 25/064* (2016.02); *H02K 2201/18* (2013.01)

(58) Field of Classification Search
CPC ............. G03F 7/70825; G03F 7/70833; G03F 7/70758; G03F 7/705; G03F 7/70725; G03F 7/70775; G03F 7/709; H02P 25/064; H02P 25/06; H02P 25/062; H02P 25/066; H02P 25/08; H02P 6/006; H02P 6/182; H02P 6/16; H02P 6/14; H02P 6/18; H02P 6/28; H02P 6/34; H02P 2006/045; H02K 41/031; H02K 41/0354; H02K 41/02; H02K 41/025; H02K 41/03; H02K 2201/18
USPC ...... 355/53, 72–77; 310/12.01, 12.04, 12.05, 310/12.06; 318/135, 632, 608, 611, 652, 318/809
See application file for complete search history.

(56) References Cited

U.S. PATENT DOCUMENTS

| | | | |
|---|---|---|---|
| 6,879,375 | B1 | 4/2005 | Kayama |
| 2004/0164253 | A1 | 8/2004 | Ito |
| 2007/0069666 | A1 | 3/2007 | Van Eijk et al. |
| 2007/0258079 | A1* | 11/2007 | Kamidi ............... G03F 7/70725 355/72 |
| 2010/0237819 | A1* | 9/2010 | Binnard ............... G05B 19/404 318/632 |
| 2011/0242660 | A1 | 10/2011 | Hsin et al. |
| 2013/0116814 | A1* | 5/2013 | Yang ................... G03F 7/70725 700/121 |
| 2014/0375975 | A1 | 12/2014 | Van De Ven et al. |
| 2016/0065043 | A1* | 3/2016 | Lu ............................ H02K 7/09 318/135 |

FOREIGN PATENT DOCUMENTS

| | | |
|---|---|---|
| JP | 2002367893 A | 12/2002 |
| TW | 312752 B | 8/1997 |
| WO | WO 2017/137181 A1 | 8/2017 |

OTHER PUBLICATIONS

International Preliminary Report on Patentability directed to related International Patent Application No. PCT/EP2018/073792, dated Apr. 21, 2020; 9 pages.

* cited by examiner

MOTOR, DUAL STROKE STAGE AND LITHOGRAPHIC APPARATUS

CROSS-REFERENCE TO RELATED APPLICATIONS

This application claims priority of EP Application Number 17196860.5, which was filed on Oct. 17, 2017, and EP Application Number 18160692.2, which was filed on Mar. 8, 2018, and which are both incorporated herein in their entirety by reference.

FIELD OF THE INVENTION

The present invention relates to a motor, a dual stroke stage and a lithographic apparatus.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, motors are used to drive movable parts of the lithographic apparatus. For example, in a scanner-type lithographic apparatus, a linear motor may be used to move a substrate supported on a substrate support or a patterning device supported on a patterning device support in a scanning movement.

To accurately control the position of a substrate and/or patterning device, dual stroke stages are used. In a dual stroke stage, a long stroke linear motor is used to move a long stroke stage over a relatively large movement range with relatively low accuracy in combination with a short stroke stage that can be moved by a short stroke linear motor over a relatively small movement range but with high accuracy. The short stroke stage is supported by the long stroke stage.

By controlling the position of the short stroke stage, the short stroke stage can be accurately position in a desired position as long as this desired position is within the small movement range of the short stroke stage. The movement of the long stroke stage is used to position the desired position of the short stroke stage within the small movement range of the short stroke stage.

In order to increase production performance of the lithographic apparatus, there is a continuous demand to increase the production capacity and the alignment and focus performance of the lithographic process.

With this increasing demand on the production capacity of the lithographic process, the speed and acceleration of the substrate support and the patterning device support have to be increased. With increasing speed and acceleration, the dual stroke stage may become a more dominant source of vibrations in the lithographic apparatus which is generally undesirable.

SUMMARY OF THE INVENTION

It is an object of the invention to provide a motor, in particular a linear motor that allows high speed and acceleration levels, while at the same time vibrations caused by the linear motor are substantially reduced.

According to an aspect of the invention, there is provided motor comprising:
a stationary part, comprising:
  a row of coil assemblies,
a movable part, comprising:
  a row of permanent magnets, wherein the row of coil assemblies has a first length and the row of permanent magnets has a second length, wherein the second length is smaller than the first length, wherein the coil assemblies are arranged to interact with permanent magnets aligned with the coil assemblies to generate a driving force,
a comparator to compare a position measurement signal representative for an actual position of the movable part with a set-point signal representative for a desired position of the movable part to provide an error signal;
a motion feedback controller configured to provide a control signal on the basis of the error signal; at least one current amplifier configured to provide an actuation signal to the coil assemblies on the basis of the control signal,
wherein the motor comprises a feedforward device, wherein the feedforward device is configured to provide a current amplifier feedforward signal on the basis of the set-point signal, or a derivative thereof, wherein the current amplifier feedforward signal is provided to the at least one current amplifier to compensate for unbalanced back electromotive forces on one or more of the coil assemblies due to the one or more coil assemblies being only partly aligned with the permanent magnets.

According to an aspect of the invention, there is provided a motor comprising:
a stationary part, comprising:
  a first row of coil assemblies,
  a second row of coil assemblies, wherein the coil assemblies of the first row and the second row are multiple phase coil assemblies,
a movable part, comprising:
  a first row of permanent magnets, and
  a second row of permanent magnets, extending in parallel to the first row of permanent magnets,
wherein the first row of coil assemblies and the second row of coil assemblies each have a first length and wherein the first row of permanent magnets and the second row of permanent magnets each have a second length, wherein the second length is smaller than the first length, wherein the coil assemblies are arranged to interact with permanent magnets aligned with the coil assemblies to generate a driving force,
wherein the first row of permanent magnets and the second row of permanent magnets are arranged between the first row of coil assemblies and the second row of coil assemblies, wherein the first row of permanent magnets is mirrored with the second row of permanent magnets with respect to a minor plane extending in parallel and between the first row of permanent magnets and the second row of permanent magnets, and wherein an order of phases of each respective coil assembly of the first row of coil assemblies corresponds to an order of phases of a, with respect to the minor plane, opposite coil assembly of the second row of coil assemblies, such that when the respective coil assembly and the opposite coil assembly are driven with fixed and constant currents edge effects in a direction perpendicular to the mirror plane are substantially cancelled.

According to an aspect of the invention, there is provided a dual stroke stage to support an object comprising a long stroke stage movably supported on a support frame and a short stroke stage movably supported on the long stroke stage, wherein the short stroke stage is arranged to support the object, and wherein the movable stage comprises a linear motor according to the present invention to drive the long stroke stage with respect to the support frame.

According to an aspect of the invention, there is provided a system identification method comprising a parameter identification procedure, the parameter identification procedure comprising the steps of:

a) acquiring error traces of relevant parameters, b) calculating optimal feed forward parameters from these error traces, c) using the calculated optimal feed forward parameters in a feedforward model, and d) repeating steps 1-3 until desired accuracy is obtained, wherein step b) comprises minimizing a cost function:

$$J(\theta):=e(\theta)^T We(\theta),$$

wherein the value J of the cost function is the energy in an error e, which is a function of the feedforward parameters, wherein W is a weighting matrix, where specific parts of the error e can be emphasized, wherein minimizing the cost function comprises calculating parameters minimizing the cost function from an acquired error trace e using $$\theta_{new}=\theta_{old}+Le,$$

wherein L is a learning matrix and $\theta_{old}$ are previous feedforward parameters, wherein the learning matrix L is computed a priori and includes rough estimates of characteristics of the system.

According to an aspect of the invention, there is provided a lithographic apparatus comprising:

a patterning device support constructed to support a patterning device, the patterning device being capable of imparting the radiation beam with a pattern in its cross-section to form a patterned radiation beam;

a substrate support constructed to hold a substrate;

a projection system configured to project the patterned radiation beam onto a target portion of the substrate;

wherein the patterning device support and/or the support comprises a dual stroke stage comprising:

a long stroke stage movably supported on a support frame, and a short stroke stage movably supported on the long stroke stage, wherein the short stroke stage is arranged to support the object, and wherein the movable stage comprises a linear motor according to the invention to drive the long stroke stage with respect to the support frame.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
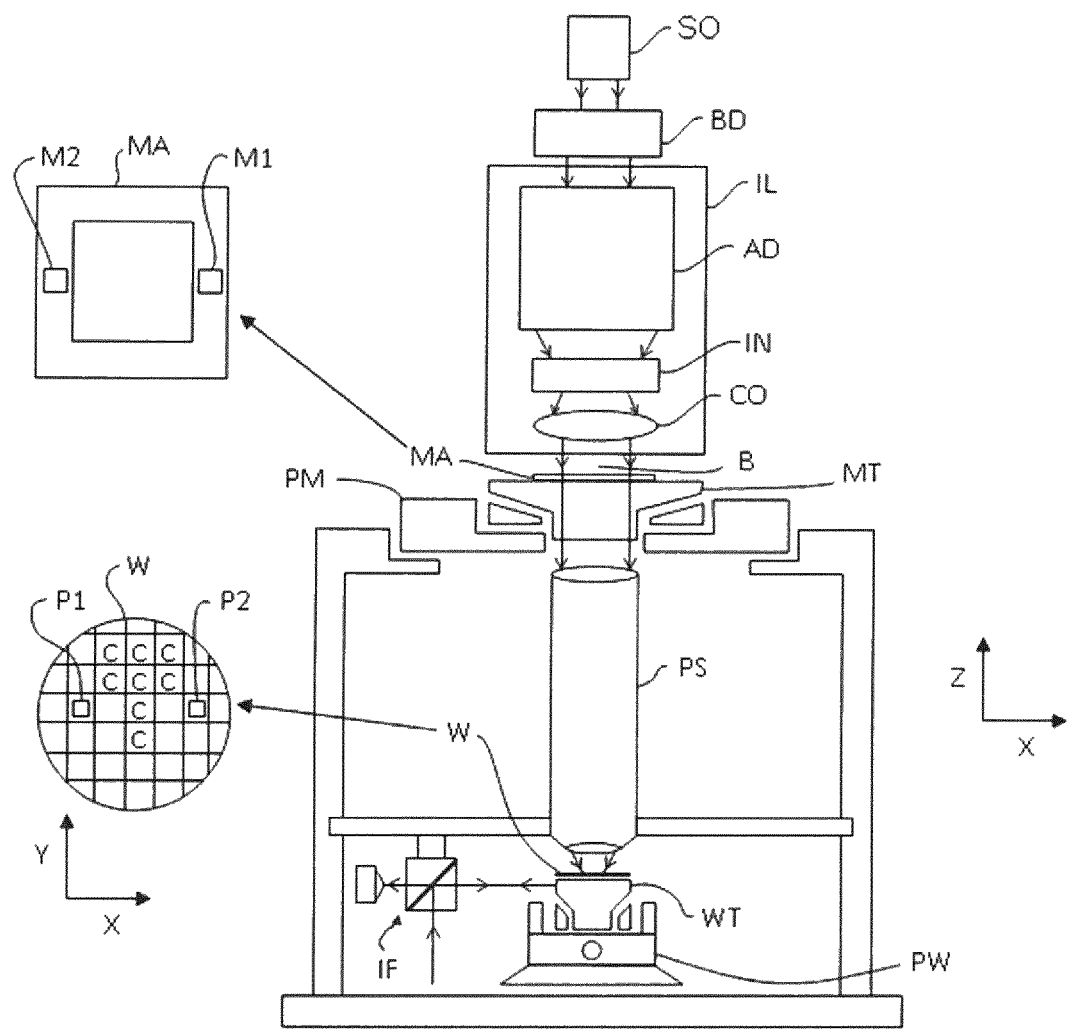
FIG. 1 depicts a lithographic apparatus in which embodiments of the invention may be provided.

FIG. 1 schematically depicts a lithographic apparatus according to one embodiment of the invention. The apparatus comprises an illumination system IL, a support structure MT, a substrate table WT and a projection system PS.

The illumination system IL is configured to condition a radiation beam B. The support structure MT (e.g. a mask table) is constructed to support a patterning device MA (e.g. a mask) and connected to a first positioner PM configured to accurately position the patterning device in accordance with certain parameters. The substrate table WT (e.g. a wafer table) is constructed to hold a substrate W (e.g. a resist-coated wafer) W and connected to a second positioner PW configured to accurately position the substrate in accordance with certain parameters. The projection system PS is configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The term "radiation beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam will correspond to a particular functional layer in a device being created in the target portion C, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small minors, each of which can be individually tilted so as to reflect an incoming radiation beam B in different directions. The tilted minors impart a pattern in a radiation beam B which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables WT (and/or two or more mask tables). In such "multiple stage" machines the additional tables may be used in parallel, or preparatory steps may be carried out on one or more tables while one or more other tables are being used for exposure. In addition to one or more substrate tables WT, the lithographic apparatus may have a measurement stage that is arranged to be at a position beneath the projection system PS when the substrate table WT is away from that position. Instead of supporting a substrate W, the measurement stage may be provided with sensors to measure properties of the lithographic apparatus. For example, the projection system may project an image on a sensor on the measurement stage to determine an image quality.

The lithographic apparatus may also be of a type wherein at least a portion of the substrate W may be covered by a liquid having a relatively high refractive index, e.g. water, so as to fill a space between the projection system and the substrate. An immersion liquid may also be applied to other spaces in the lithographic apparatus, for example, between the patterning device MA and the projection system PS. Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illumination system IL receives a radiation beam B from a radiation source SO. The radiation source SO and the lithographic apparatus may be separate entities, for example when the radiation source SO is an excimer laser. In such cases, the source is not considered to form part of the lithographic apparatus and the radiation beam B is passed from the radiation source SO to the illumination system IL with the aid of a beam delivery system BD comprising, for example, suitable directing minors and/or a beam expander. In other cases the radiation source SO may be an integral part of the lithographic apparatus, for example when the radiation source SO is a mercury lamp. The radiation source SO and the illuminator IL, together with the beam delivery system BD if required, may be referred to as a radiation system.

The illumination system IL may comprise an adjuster AD for adjusting the angular intensity distribution of the radiation beam B. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator IN and a condenser CO. The illumination system IL may be used to condition the radiation beam B, to have a desired uniformity and intensity distribution in its cross-section.

The radiation beam B is incident on the patterning device MT, which is held on the support structure MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module and a short-stroke module, which form part of the first positioner PM. The long-stroke module may provide coarse positioning of the short-stroke module over a large range of movement. The short-stroke module may provide fine positioning of the support structure MT relative to the long-stroke module over a small range of movement. Similarly, movement of the substrate table WT may be realized using a long-stroke module and a short-stroke module, which form part of the second positioner PW. The long-stroke module may provide coarse positioning of the short-stroke module over a large range of movement. The short-stroke module may provide fine positioning of the substrate table WT relative to the long-stroke module over a small range of movement. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C (these are known as scribe-lane alignment marks). Similarly, in situations in which more than one die is provided on the patterning device MA, the mask alignment marks M1, M2 may be located between the dies.

The depicted apparatus could be used in at least one of the following modes:

In a first mode, the so-called step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In a second mode, the so-called scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In a third mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

Figure 2:
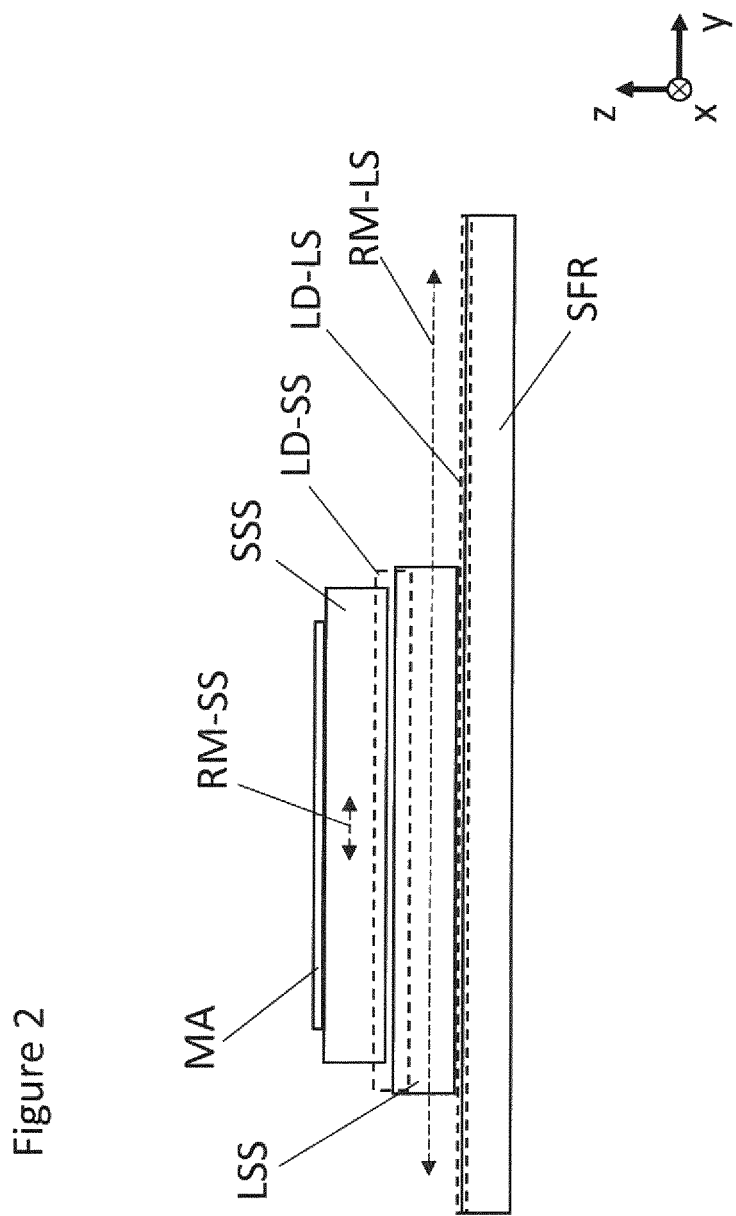
FIG. 2 shows schematically a side view of a dual stroke stage according to a first embodiment of the invention.

FIG. 2 shows a support structure MT for a patterning device MA comprising a dual stroke stage. The dual stroke stage is arranged to make a linear movement in y-direction in order to make a scanning movement of the support structure MT, as required in the scan mode described above.

The dual stroke stage comprises a short stroke stage SSS to support the patterning device MA. The short stroke stage SSS is movably supported by a long stroke stage LSS. The long stroke stage LSS is in its turn movably supported by a support frame SFR. A short stroke linear motor LD-SS is provided to move the short stroke stage SSS in the y-direction over a relatively short range of movement RM-SS with respect to the long stroke stage LSS. Within this short range of movement RM-SS, the short stroke stage SSS can be positioned by the short stroke linear motor LD-SS with high accuracy.

A long stroke linear motor LD-LS is provided to move the long stroke stage MT in the y-direction over a relatively large range of movement RM-LS with respect to the support frame SFR. Within this large range of movement RM-LS, the short stroke stage SSS can be positioned by the long stroke linear motor LD-LS with a smaller degree of accuracy compared with the accuracy of positioning of the short stroke linear motor LD-SS.

The long stroke stage LSS is used, within the large range of movement RM-LS, to move the long stroke stage LSS to a position in which a desired position of the patterning device MA is within the short range of movement RM-SS of the short stroke stage SSS. This position of the long stroke stage LSS thus enables the short stroke linear motor LD-SS to position, within the short range of movement RM-SS, the patterning device MA that is supported on the short stroke stage SSS in the desired position with high accuracy.

Figure 3:
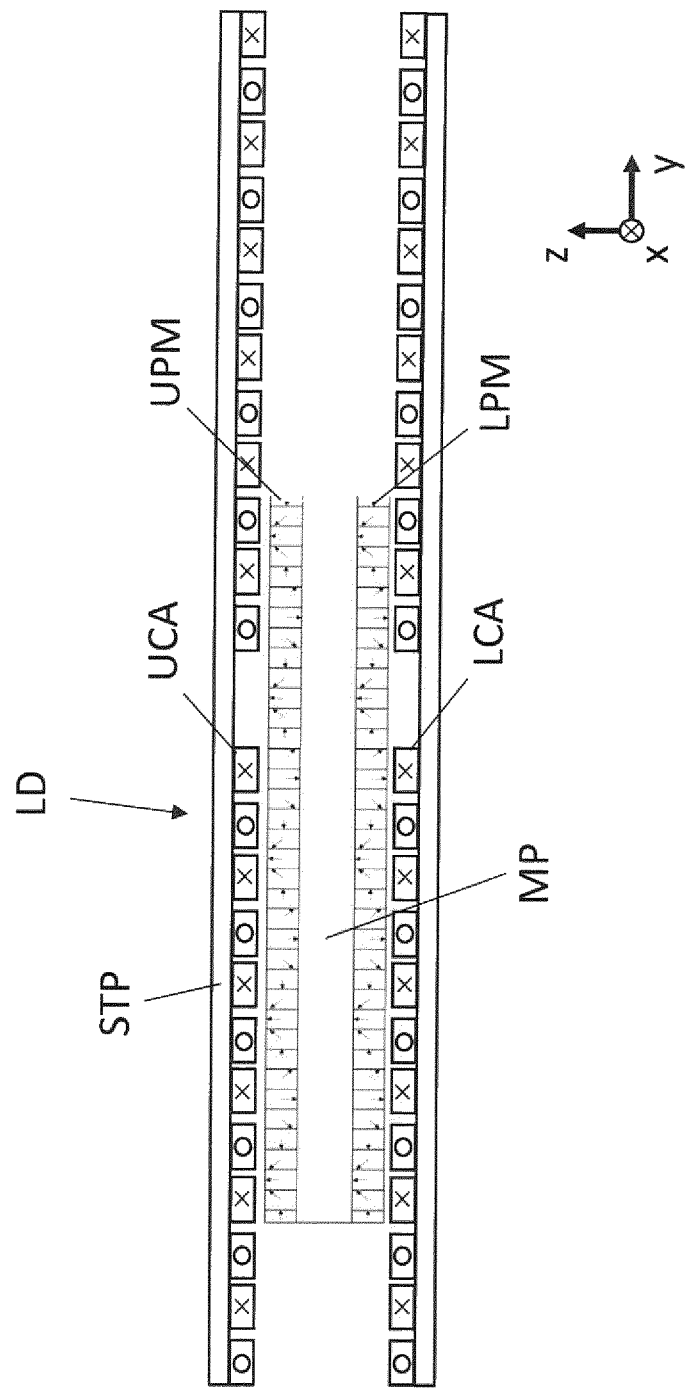
FIG. 3 shows schematically a side view of a linear motor according to a first embodiment of the invention.

FIG. 3 shows an embodiment of a linear motor LD. The linear motor LD comprises a stationary part STP and a movable part MP. The movable part MP is movable with respect to the stationary part STP over a relatively long range of movement in the y-direction to make a scanning movement in this direction and a relatively small range of movement in the z-direction to adjust a height position of the movable part MP or to make a rotation about an axis in x-direction, whereby the x-direction is perpendicular to the y-direction and z-direction.

The stationary part STP comprises a first row of coil assemblies UCA and a second row of coil assemblies LCA. In the embodiment as shown, the first row UCA is arranged above the second row LCA. The first row of coil assemblies may also be referred to as the upper row of coil assemblies UCA, while the second row of coil assemblies may also be referred to as the lower row of coil assemblies LCA. The upper row of coil assemblies UCA and the lower row of coil assemblies LCA both extend in y-direction, and the upper row of coil assemblies UCA is arranged above the lower row of coil assemblies LCA. Each of the upper row of coil assemblies UCA and the lower row of coil assemblies LCA comprises four three phase coil assemblies.

The movable part MP comprises a first row of permanent magnets UPM, also referred to as the upper row of permanent magnets UPM, and a second row of permanent magnets LPM, also referred to as the lower row of permanent magnets LPM. Both the upper row of permanent magnets UPM and the lower row of permanent magnets LPM extend in the y-direction, and the upper row of permanent magnets UPM is arranged above the lower row of permanent magnets LPM. The upper row of permanent magnets UPM and the lower row of permanent magnets LPM are arranged between the upper row of coil assemblies UCA and the lower row of coil assemblies LCA, whereby the coil assemblies of the upper row of coil assemblies UCA may interact with the permanent magnets of the upper row of permanent magnets UPM to generate a driving force on the movable part MP. Correspondingly, the coil assemblies of the lower row of coil assemblies LCA may interact with the permanent magnets of the lower row of permanent magnets LPM to generate a driving force on the movable part MP.

The linear motor LD of FIG. 3 can be applied as a long stroke linear motor LD-LS shown in FIG. 2. In such embodiment, the stationary part STP of the linear motor LD may be mounted on the supporting frame SFR and the movable part MP of the linear motor LD may be mounted on the long stroke stage LSS.

The coil assemblies are driven by respective current amplifiers that provide for each phase of each coil assembly an actuation signal to actuate the respective coil assemblies of the linear motor LD.

Since the permanent magnets of the upper row of permanent magnets UPM and the lower row of permanent magnets LPM are moved with respect to the coil assemblies, not all coil assemblies are equally aligned with the permanent magnets, i.e. some coil assemblies are not or only partly aligned with the permanent magnets in dependence of the position of the movable part MP with respect to the stationary part STP. As a result, the back electromotive force of the load on the coil assemblies is not always evenly distributed over the different phases of a single coil assembly. The term back electromotive force here refers to the voltage that occurs in the coil assemblies as a result of a relative motion between the coil assemblies mounted on the stationary part STP and the permanent magnets mounted on the movable part MP.

For example, in the position shown in FIG. 3, the coil assemblies aligned with the edges of the upper row of permanent magnets UPM and the lower row of permanent magnets LPM, only partly interact with the respective permanent magnets. This means that not all phases of the coil assemblies equally interact with the permanent magnets of the upper row of permanent magnets UPM and the lower row of permanent magnets LPM. This results in an uneven distribution of the back electromotive forces on the different phases of the coil assemblies which distribution changes upon movement of the movable part MP with respect to the stationary part STP. This uneven distribution of back electromotive forces may cause substantial disturbances on the current amplifiers. These disturbances, which hereinafter are also indicated as edge effects may cause undesired vibrations in the linear motor LD which have a substantial effect on the performance of the dual stroke stage, in particular on the focus and alignment of the patterned radiation beam on the target portion of the substrate.

It is remarked that load resistance, load self-inductance and/or load mutual inductance of the linear motor LD may also cause substantial disturbances on the current amplifiers resulting in undesired vibrations of the linear motor LD.

Figure 4:
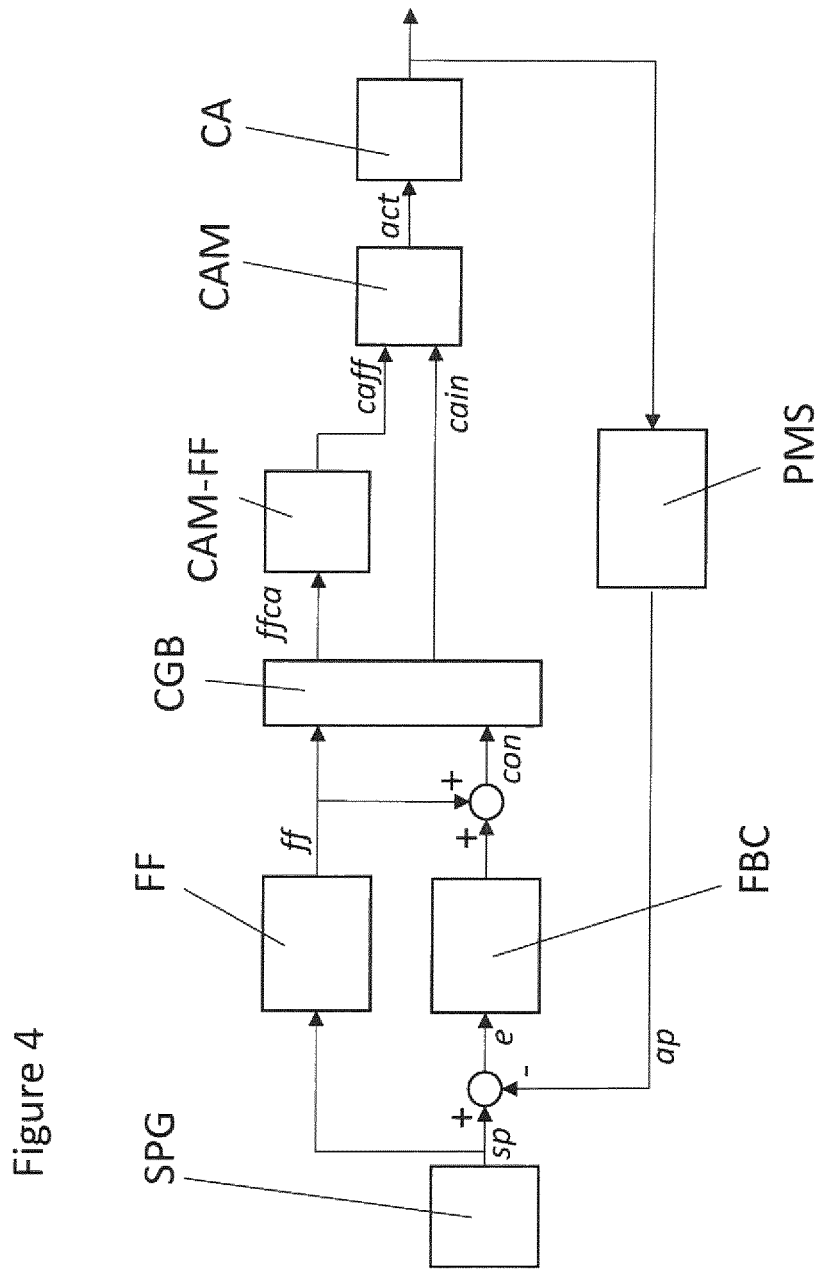
FIG. 4 shows a control scheme for the linear motor shown in FIG. 2.

The present invention provides a control method for a linear motor LD as shown in FIG. 4 that at least partly compensates the vibrations caused by back electromotive forces in the coil assemblies of the linear motor LD. The same control method may also be used to at least partially compensate the effects of load resistance, load self-inductance and/or load mutual inductance.

FIG. 4 shows a control scheme to control the position of the movable part MP of the linear motor LD. A set point generator SPG is arranged to provide at an output terminal a set-point signal sp representative for a desired position of the movable part MP. The set point signal sp is compared in a comparator with an actual position ap of the movable part MP as determined by a position measurement system PMS, for example an interferometer system. The error signal e is fed at an input terminal into a motion feedback controller FBC that provides at an output terminal an output signal on the basis of the error signal e.

The set point signal sp, or a derivative thereof, is also fed at an input terminal into a feedforward device FF that provides at an output terminal a feedforward signal ff that can be used for motion feedforward. The motion feedforward may for example be used to compensate for delay that may occur in the feedback loop of the motion feedback controller FBC. The feedforward signal ff is added to the output signal of the motion feedback controller FBC to provide a control signal con to actuate the linear motor. The control signal con is for example a signal that comprises 3 DOF force commands (Fy, Fz, Rx) that should be applied to the movable part MP to move the movable part MP to a desired position.

The control signal con is fed at an input terminal into a commutation and gain balancing device CGB to translate the 3 DOF force commands in current amplifier input signals cain for each of the coil assemblies of the upper row of coil assemblies UCA and the lower row of coil assemblies LCA. The resulting current amplifier input signal cain provided at an output terminal of the commutation and gain balancing device CGB is fed at an input terminal into a current amplifier CAM that provides at an output terminal an actuation signal act for each phase of each coil assembly CA to drive the movable part MP to the desired position.

It is remarked that for each coil assembly CA a current amplifier CAM is provided, and therefore for each current amplifier CAM an individual current amplifier input signal cain is provided. This means that for the embodiment shown in FIG. 3, having eight three phase coil assemblies, also eight current amplifiers CAM are provided. The eight current amplifiers CAM will provide on the basis of the current amplifier input signal cain a specific actuation signal act for each phase of the coil assembly CA associated with the respective current amplifier CAM.

In addition to the motion feedforward, the feedforward signal ff is also fed at an input terminal into the gain balancing device CGB to translate the feedforward signal ff in a feedforward signal ffca for each of the coil assemblies. This feedforward signal ffca provided at an output terminal of the gain balancing device CGB is fed at an input terminal into a current amplifier feedforward device CAM-FF that is arranged to provide at an output terminal a current amplifier feedforward signal caff on the basis of the feedforward signal ffca. The current amplifier feedforward signal caff is in particular designed to compensate for the edge effects of back electromotive forces on the current amplifier CAM of the respective coil assemblies. The current amplifier feedforward signal caff is fed at an input terminal into the current amplifier CAM to at least compensate for the edge effects of back electromotive forces.

Further, the current amplifier feedforward device CAM-FF may, as an alternative or in addition, be arranged to compensate for other effects that may occur in a linear device with three phase coil assemblies arranged on the stationary part STP and permanent magnets arranged on the movable part MP of the linear motor LD. The current amplifier feedforward device CAM-FF may for example be arranged to compensate load resistance, load self-inductance and/or load mutual inductance.

To compensate mutual effects between different phases of a coil assembly and/or between the different coil assemblies, the current amplifier feedforward device CAM-FF is preferably a multiple input-multiple output (MIMO) feedforward device that takes into account these mutual effects.

Calibration and/or tuning of the current amplifier feedforward device CAM-FF may be performed on the basis of an actual state of the coil assemblies, for example a voltage and/or current measured in the respective coil assemblies. These actual currents and voltages may be obtained by current sensors and voltage sensors. Parameters of the current amplifier feedforward device CAM-FF may thus be determined on the basis of the actual currents and/or voltages measured by the current sensors and voltage sensors, but also by any other suitable method.

Figure 5:
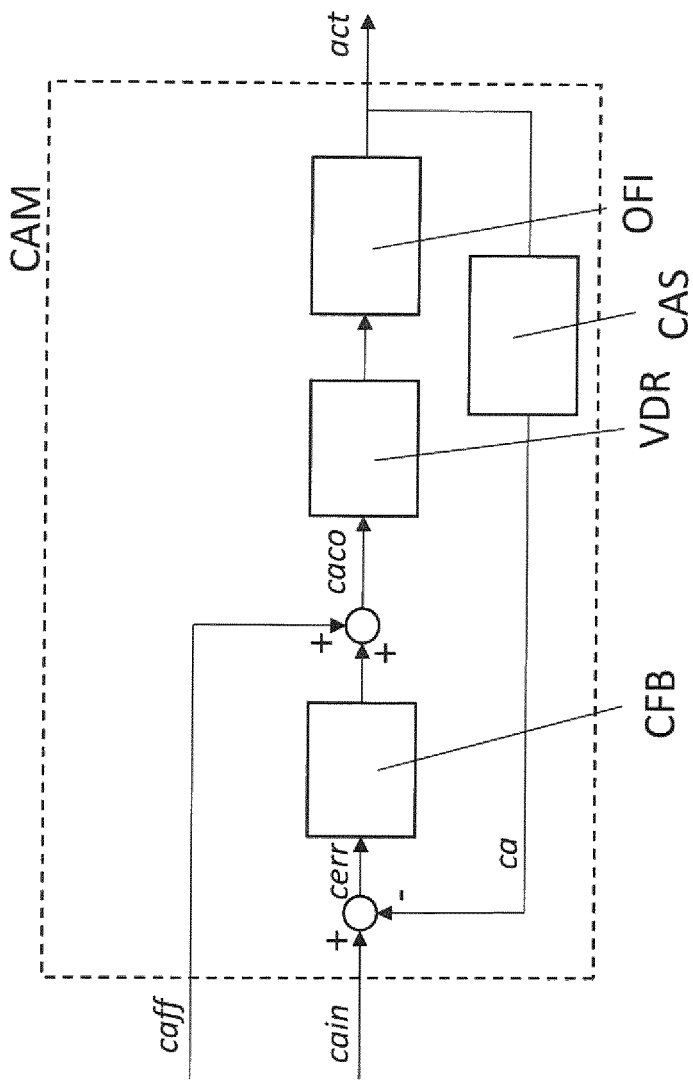
FIG. 5 shows a control scheme of the current amplifier(s) of the control scheme shown in FIG. 4.

FIG. 5 shows the current amplifier CAM of the control scheme of FIG. 4 in more detail. The current amplifier CAM comprises a current amplifier comparator to compare the current amplifier input signal cain with an actual state of the current amplifier CAM as measured by a sensor CAS in order to provide a current amplifier error signal cerr representative for a difference between a desired state, represented by the current amplifier input signal cain, and an actual state ca of the respective coil assembly as measured by the sensor CAS.

It is remarked that the current amplifier CAM may be a voltage controlled current amplifier or a current controlled current amplifier. The actual state ca and the desired state, represented by the current amplifier input signal cain may be voltage signals or current signals. Any other suitable signals may also be used.

The current error signal cerr is fed at an input terminal into a current amplifier feedback controller CFB to provide at an output terminal a current amplifier control signal on the basis of the current amplifier error signal cerr. The current amplifier feedforward signal caff that is provided by the current amplifier feedforward device CAM-FF is added to the output signal of the current amplifier feedback controller CFB to provide a current amplifier control signal caco that is fed into a serial combination of a pulse-width modulation voltage drive VDR and an LC output filter OFI. This combination transforms the current amplifier control signal caco into an actuation signal act for each phase of the respective coil assembly.

This results in movement of the movable part MP of the linear motor LD to a desired position, while vibrations caused by back electromotive forces are substantially reduced due to the current feedforward signal caff provided by the current amplifier feedforward device CAM-FF.

The accuracy of the currents achieved with the current amplifier feedforward device CAM-FF is highly dependent on the accuracy of the feedforward parameters. These feedforward parameters reflect the physical behavior of the linear motor LD. However, physical characteristics, such as resistance, inductance, mutual inductance, and back EMF may be different for each physical combination of a permanent magnet and a coil, for example due to variations in manufacturing. To achieve the required accuracy the parameters may be identified from the real physical system using a system identification method such that the variations in the different characteristics and their effect in the parameters are taken into account.

In a conventional system identification method a dedicated parameter perturbation experiment should be performed for each current amplifier CAM-FF, and for each parameter. These parameter perturbation experiments cannot be performed during normal operation of the lithographic apparatus. Therefore, the need of parameter perturbation experiments directly results in a availability loss or extra system integration time.

The linear motor design, as shown in FIG. 3, having moving magnets and stationary coil assemblies requires a current amplifier CAM for each coil. This has the additional consequence that the total number of amplifiers substantially increases with respect to motor designs having moving coil assemblies and stationary permanent magnets. For example, the motor design of FIG. 3 requires 24 amplifiers, while a similar motor with moving coil assemblies would only have 8 amplifiers. Separate parameter perturbation experiments for each of the current amplifiers CAM will take considerable time. It is therefore desirable that the identification of the parameters of the feedforward device CAM-FF does not interrupt the normal operation of the lithographic apparatus to a large extent.

According to an aspect of the invention, there is provided an identification method to determine feedforward parameters of the feedforward device CAM-FF in which interruption of the normal operation of the lithographic apparatus can be substantially decreased.

This identification method is based on an algorithm arranged to minimize the following cost function:

$$J(\theta):=e(\theta)^T We(\theta),$$

wherein the value J of the cost function is the energy in the current error e, which is a function of the feedforward parameters. W is a weighting matrix, where specific parts of the error e can be emphasized. The current error e is defined as the difference between current set-point and achieved current.

The parameters that minimize this cost function are calculated from a measured error trace e using $$\theta_{new} = \theta_{old} + Le.$$

wherein L is a learning matrix and $\theta_{old}$ are previous feedforward parameters. These previous feedforward parameters may often be equal to zero. The learning matrix L is computed a priori and includes rough estimates of physical motor characteristics, e.g. from CAD drawings, FEM calculations, or a previous identification measurement as will be explained below. The key idea is that given a rough estimate a priori, a significantly better identification of the real physical parameters can be achieved by learning from the physical current errors. Note that these error measurements can be obtained while the scanner is exposing wafers, hence no loss of throughput or availability is imposed when carrying out this identification method. It is remarked that the error measurements can also be obtained while the scanner is carrying out other process steps, i.e. not exposing wafers. It has been found that the convergence of the proposed algorithm is experienced to be good in compared to other feedforward model optimizations.

The learning matrix L can be defined as follows:

$$L = [\Psi^T J^T W J \Psi]^{-1} \Psi^T J^T W$$

wherein W is a weighting matrix from the cost function, J is a Toeplitz matrix containing a rough estimate of the impulse response of the so-called process sensitivity, which is the response in current given a unit impulse in voltage, while the amplifier feedback control is active, and $\Psi$ is a matrix which directly results from the implemented feedforward model as follows.

When the feedforward model be denoted as $u_{ff} = F(\theta, r) I_{SP}$, wherein Uff is the feedforward voltage, F the feedforward model (that is linear in parameters $\theta$), Isp the current set-point, and r the RS Long stroke position set-point. Then follows:

$$\Psi = \frac{\partial F(\theta, r)}{\partial \theta} I_{SP}.$$

The impulse response can be obtained, as mentioned above, from a simulation using CAD & FEM data, or a preliminary measurement. It does not need to be very accurate in order to obtain convergence of the parameter identification algorithm. The more accurate the prior information, the faster the errors are reduced over repetitions of the steps of the parameter identification method.

The tuning method can conceptually be applied to the identification of the parameters of any linear feedforward model, as long is the model is linear in the parameters and as long as the required a priori information is available.

Generally, the parameter identification procedure according to this aspect of the invention can be described by the following steps:

1. Acquiring error traces, preferably during normal usage, of relevant parameters, for example support structure MT long stroke position set-point, current amplifier input signal cain and the actual state of the current amplifier CAM.
2. Calculating optimal feed forward parameters from these error traces, 3. Using the calculated optimal feed forward parameters in the feedforward model, and
4. Repeating steps 1-3 until desired accuracy is obtained.

The calculation of the optimal feed forward parameters from the traces may comprise the following steps:

Minimizing a cost function:

$$J(\theta) := e(\theta)^T W e(\theta),$$

wherein the value J of the cost function is the energy in an error e, which is a function of the feedforward parameters, wherein W is a weighting matrix, where specific parts of the error e can be emphasized.

The parameters that minimize this cost function are calculated from an acquired error trace e using $$\theta_{new} = \theta_{old} + Le.$$

wherein L is a learning matrix and $\theta_{old}$ are previous feedforward parameters. The learning matrix L is computed a priori and includes rough estimates of characteristics of the system.

The learning matrix L can be defined as follows:

$$L = [\Psi^T J^T W J \Psi]^{-1} \Psi^T J^T W$$

wherein W is a weighting matrix from the cost function, J is a Toeplitz matrix containing a rough estimate of an impulse response of a so-called process sensitivity.

With the above-described identification method, the accuracy of the output of the current amplifiers CAM can be substantially improved. Since the current amplifiers CAM are part of the overall servo system, this improvement has a positive influence on the reduction of disturbance forces in the servo system and as a result in the reduction of distortions in sensitive systems like for example the projection optics box POB.

Figure 6:
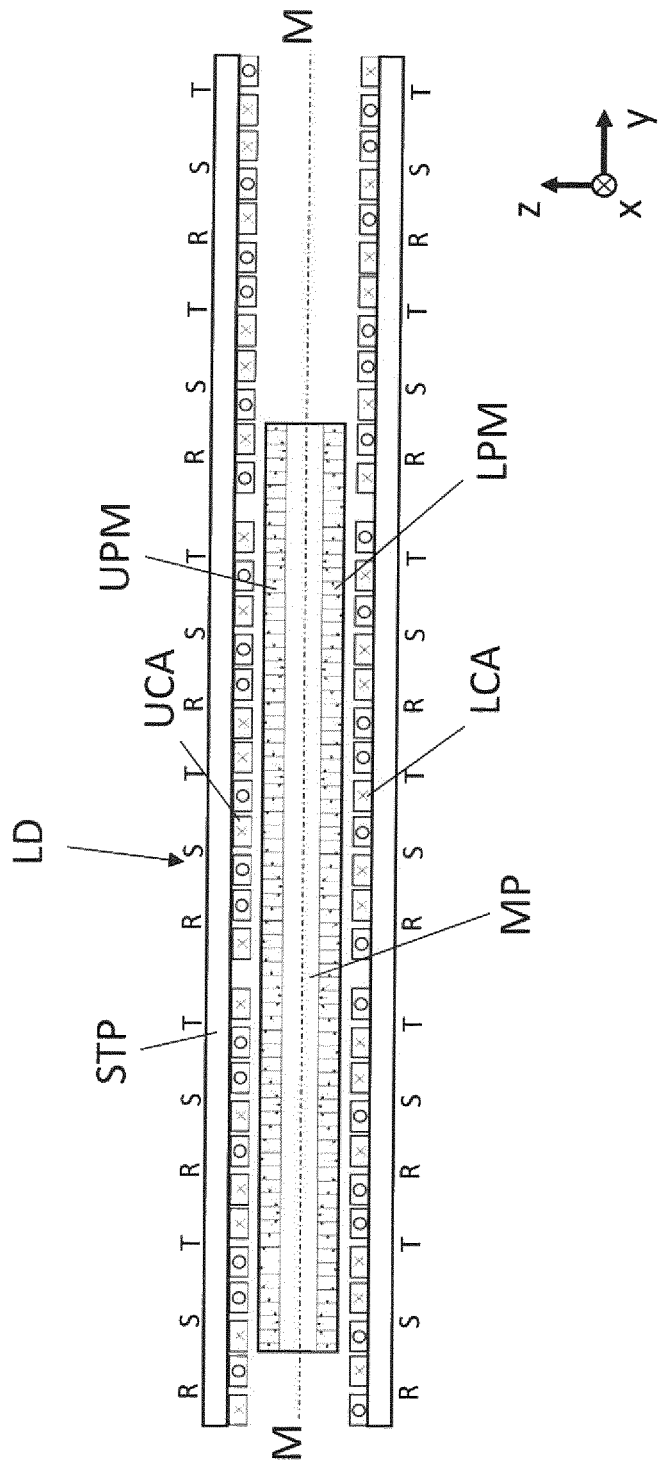
FIG. 6 shows schematically a side view of a linear motor according to a second embodiment of the invention.

FIG. 6 shows a linear motor LD according to a second embodiment of the invention.

The linear motor LD of FIG. 6 comprises a stationary part STP and a movable part MP. The stationary part STP comprises an upper row of coil assemblies UCA and a lower row of coil assemblies LCA. The upper row of coil assemblies UCA and the lower row of coil assemblies LCA both extend in y-direction, and the upper row of coil assemblies UCA is arranged above the lower row of coil assemblies LCA. Each of the upper row of coil assemblies UCA and the lower row of coil assemblies LCA comprises six three phase coil assemblies. The order of the three phases of each of the coil assemblies is indicated by phase indicators R, S, and T.

The movable part MP comprises an upper row of permanent magnets UPM and a lower row of permanent magnets LPM. Both the upper row of permanent magnets UPM and the lower row of permanent magnets LPM extend in the y-direction, and the upper row of permanent magnets UPM is arranged above the lower row of permanent magnets LPM. Further, the upper row of permanent magnets UPM and the lower row of permanent magnets LPM is arranged between the upper row of coil assemblies UCA and the lower row of coil assemblies LCA, whereby the coil assemblies of the upper row of coil assemblies UCA may interact with the permanent magnets of the upper row of permanent magnets UPM and the coil assemblies of the lower row of coil assemblies LCA may interact with the permanent magnets of the lower row of permanent magnets LPM.

The linear motor LD of FIG. 6 can be applied as a long stroke linear motor LD-LS shown in FIG. 2. In this embodiment, the stationary part STP of the linear motor LD may be mounted on the supporting frame SFR and the movable part MP of the linear motor LD may be mounted on the long stroke stage LSS. The linear motor LD may also be used in any other suitable application.

The permanent magnets and the coil wiring of the embodiment of FIG. 6 are arranged in a specific arrangement. The permanent magnets of the upper row of permanent magnets UPM are mirrored over a horizontal plane M-M with respect to the lower row of permanent magnets LPM. Further, the order of the three phases R, S, T of each respective coil assembly of the upper row of coil assemblies UCA is the same as the order of the three phases R, S, T of the opposite coil assembly arranged in the lower row of coil assemblies LCA. In this respect opposite means opposite with respect to the minor plane M-M; in other words the opposite coil assembly of the lower row of coil assemblies LCA is located directly below the respective coil assembly of the upper row of coil assemblies UCA.

This specific arrangement offers an advantage compared with designs known from prior art.

As explained with respect to the embodiment of FIG. 3, in a linear motor LD having permanent magnets on the movable part MP of the linear motor LD, not all three phases of a coil assembly are always aligned with the respective permanent magnets. As the movable part MP moves, certain three phase coil assemblies will interact with the boundary of the magnetic fields generated by the permanent magnets. This causes so-called edge effects (also referred to as run in and run out effects) that result into disturbance forces. Generally, the disturbance forces caused by the partially covered three phase coil assemblies may cause substantial vibrations in the linear motor LD which is generally unacceptable.

In the specific arrangement of the embodiment of FIG. 6, these disturbance forces may however substantially be decreased. When the respective coil assembly of the upper row of coil assemblies UCA and the opposite coil assembly of the lower row of coil assemblies LCA are driven with fixed and constant currents, and the movable part MP moves, the resulting force vectors rotate in opposite directions. As a result, if the current amplitudes through the three phase coil assembly in the upper row and the three phase coil assembly in the lower row are identical, the edge effects cancel in z-direction. Since the z-direction is a highly sensitive direction for most disturbances caused by the edge effects, the specific arrangement of permanent magnets and coil assemblies in FIG. 6 has a substantial attenuating effect on the disturbance forces caused by the edge effects.

It is thereby remarked that although in practice the current amplitudes in the upper row of coil assemblies UCA and the lower row of coil assemblies LCA will not be fully identical, since the linear motor LD may also be used for gravity compensation, it has been found that the specific arrangement of the embodiment of FIG. 6 does have a substantial positive effect on the reduction of the vibrations caused by edge effects, such as uneven distributed back electromotive forces.

Moreover, this specific arrangement significantly simplifies the gain balancing. This simplified gain balancing will hereinafter be explained in more detail.

The position of the movable part MP is typically defined as the orientation of a single actuation point with respect to the movable part MP. This single actuation point is for example the geometric center, center of gravity, or location of a pattern device, with respect to a 'zero' location.

The control of the position of the movable part MP is performed with respect to this single actuation point. This also means that the forces commanded by the motion feedback controller of motion control loop should grasp at this single actuation point.

In the arrangement of FIG. 6, the coil assemblies are mounted on the stationary part STP and the permanent magnets are mounted on the movable part MP. As a result, the position of the coil assemblies of the upper row of coil assemblies UCA and the lower row of coil assemblies LCA, i.e. where force is generated, continuously changes with respect to the position of the movable part MP when the movable part MP moves with respect to the stationary part STP.

Figure 7:
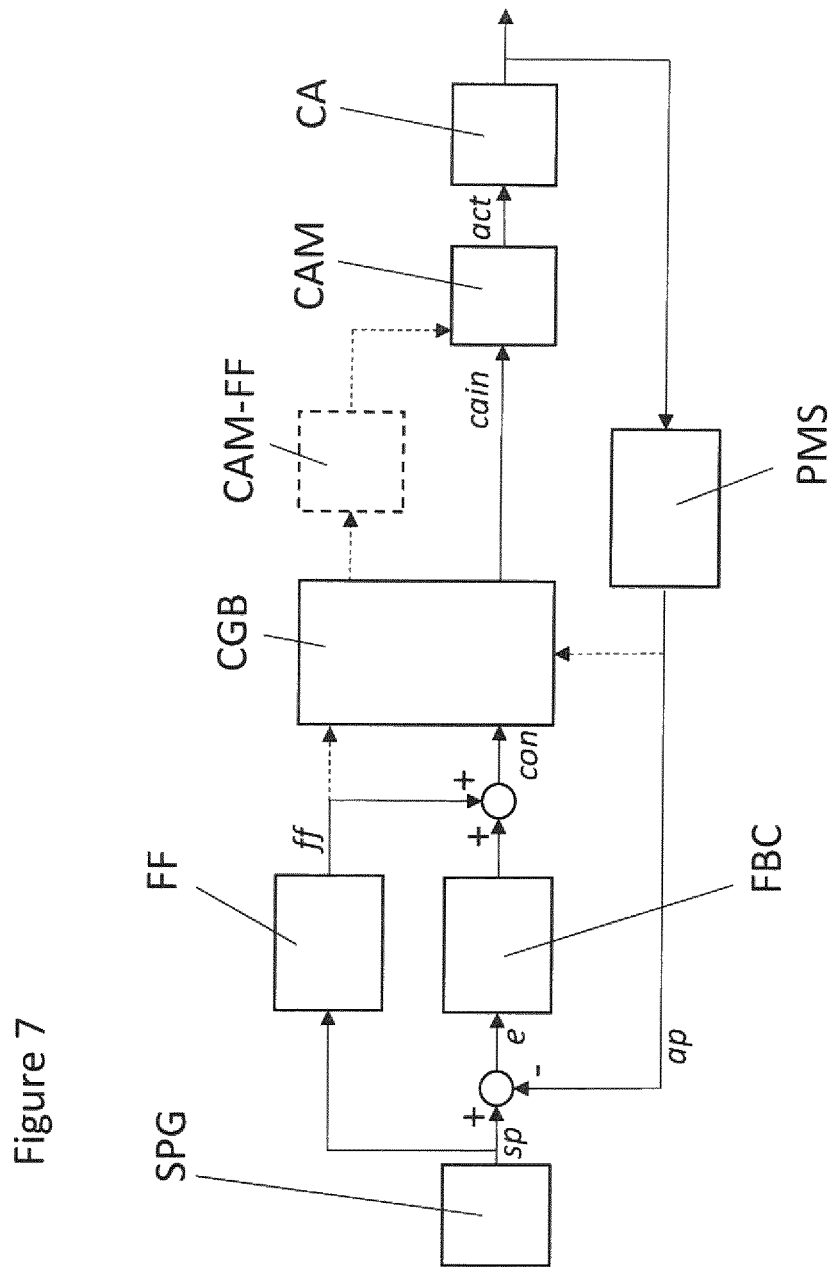
FIG. 7 shows a control scheme for the linear motor shown in FIG. 6.

FIG. 7 shows a control scheme for control of the linear motor LD shown in FIG. 6. A set point generator SPG is arranged to provide at an output terminal a set-point signal sp representative for a desired position of the movable part MP. The set point signal sp is compared in a comparator with an actual position ap of the movable part MP as determined by a position measurement system, for example an interferometer system. The error signal e is fed at an input terminal into a motion feedback controller FBC that provides at an output terminal an output signal on the basis of the error signal e.

The set point signal sp is also fed at an input terminal into a feedforward device FF that provides at an output terminal a feedforward signal ff that can be used as motion feedforward. The feedforward signal ff is added to the output signal of the motion feedback controller FBC to provide a control signal con to actuate the linear drive device LD. The control signal con is a signal that comprises three DOF force commands that should be applied at the single actuation point of the movable part MP to move the movable part MP to a desired position.

The control signal con is fed at an input terminal into a commutation and gain balancing device CGB. The role of the commutation and gain balancing device CGB is to translate the 3DOF (Fy, Fz, Trx) force commands at the single actuation point to individual current amplifier input signals cain for each of the three phase coil assemblies. The resulting individual current amplifier input signals cain provided at an output terminal of the commutation and gain balancing device CGB are fed at respective input terminals into a series of current amplifiers CAM. For each coil assembly a current amplifier CAM is provided. The current amplifiers CAM provide at an output terminal an actuation signal act, for example a current, that is fed into each respective phase of the coil assembly associated with the respective current amplifier CAM.

It is remarked that, when desired, the current amplifier feedforward device CAM-FF as described with respect to FIGS. 4 and 5 may be used to further compensate the edge effects or other disturbances on the linear motor LD. In FIG. 7 the current amplifier feedforward device CAM-FF is indicated in dashed lines.

In accordance with a further embodiment, the following commutation and gain balancing calculation steps are proposed for the embodiment of the linear motor LD shown in FIG. 6.

Generally, the commutation and gain balancing device CGB comprises the following inputs:
3DOF force commands from the motion feedback controller FBC and, when desired, the feedforward device (Fy, Fz, Trx);
2DOF y and z position measurements of the movable part MP.

To determine for each three phase coil assembly an individual current amplifier input signal cain, the required y- and z-force for each three phase coil assembly (i=1, 2, . . . 12) are calculated:

$Fyi\text{-act}=Fy/8+Trx/8/zarmi\text{-act}$ $Fzi\text{-act}=Fz/8$ wherein, Fyi-act is a force command for a single coil assembly in y-direction and Fzi-act is a force command for a single coil assembly in z-direction; zarmi-act is the z-distance of a center of a respective three phase coil assembly to the single actuation point.

In this calculation step, the specific arrangement of magnets and coil wiring of the embodiment of FIG. 6 is advantageously used. As can be seen in FIG. 6, some coil assemblies are completely aligned with the permanent magnets of the movable part MP, some partially and some are not aligned with these permanent magnets. However, at all times, an equivalent of eight complete coil assemblies (four coil assemblies of the upper row of coil assemblies UCA and four coil assemblies of the lower row of coil assemblies LCA) will be aligned with the permanent magnets of the movable part as can be seen in FIG. 6.

This means that an equivalent of eight complete three phase coil assemblies are contributing to force generation, regardless of the position, in y-direction, of the movable part MP with respect to the stationary part STP. Thus, the required Fy and Fz are simply divided over all twelve coil assemblies, knowing that only eight of the coil assemblies will physically contribute to the force generation. To generate Rx torque, a perturbation on Fy is introduced. The reason is that the arm of an Fy around the single actuation point is very well defined, and even more or less constant in practice.

On the basis of the required y- and z-force for each three phase coil assembly, i.e. Fyi-act and Fzi-act, the required current amplifier input signal cain for each three phase coil assembly can be calculated. This is performed by solving the following equations for each three phase coil assembly:

$$I_{SP} = \frac{1}{K_m}\sqrt{F_y^2 + F_z^2}$$

$$\Phi_{SP} = \text{atan2}(F_y, F_z) + \frac{2\pi y}{2\tau} + \Phi_0,$$

wherein Isp is the current amplitude, Φsp is the current phase, Km is the motor constant, τ is the magnetic pitch, and Φ0 is the commutation offset, i.e. physical y-position of the coil assembly with respect to the single actuation point of geometry.

The outputs of these equations, i.e. Isp and Φsp, can be used as current amplifier input signal cain for the current amplifier CAM of the respective coil assembly.

When the currents through the coil assemblies in the upper row of coil assemblies UCA and the lower row of coil assemblies LCA are symmetrical, it may be concluded that the linear motor LD of FIG. 6 can be operated with very limited information about the geometry of the linear motor LD. Also, the gain balancing may be independent of the y-position of the movable part MP, and can practically also be made independent of the z-position, by fixing the arm zarmi-act to a fixed value instead of using values obtained by the position measurement system PMS.

It is further remarked that individual coil assemblies of the upper row UCA and lower row LCA may be smoothly switched off, when they are, at that moment, not contributing to movement of the movable part, i.e. not aligned with the permanent magnets of the upper row of permanent magnets UPM and the lower row of permanent magnets LPM. In this respect, not aligned means arranged at a position that no substantial interaction between the respective coil assembly and the permanent magnets can take place. This switching off of coil assemblies may be applied to save energy.

Hereinabove, two embodiments of linear motors LD are described that enable substantial reduction of vibrations caused by edge effects in the linear motor LD. The first embodiment uses a current amplifier feedforward device CAM-FF, as shown in FIG. 4, and the second embodiment uses a specific arrangement of permanent magnets and coil assemblies, as shown in FIG. 6. In practice, a combination of these two embodiments may also be applied, i.e. the specific arrangement of permanent magnets and coil assemblies in combination with the use of a current amplifier feedforward device CAM-FF. In particular, the current amplifier feedforward device CAM-FF may be used to compensate the disturbing effects that may remain after application of the specific arrangement of permanent magnets and coil assemblies, for example when, in such embodiment the current amplitudes in the upper row of coil assemblies UCA and the lower row of coil assemblies LCA are not fully identical.

It is further remarked that hereinabove the use of a current amplifier feedforward device CAM-FF, and the use of a specific arrangement of permanent magnets and coil assemblies has been applied in linear motors. In alternative embodiments, the motor may be a rotary motor, wherein the row(s) of coil assemblies and the row(s) of permanent magnets may be arranged as concentric circles.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A motor comprising:
   a stationary part, comprising:
      a row of coil assemblies,
   a movable part, comprising:
      a row of permanent magnets, wherein the row of coil assemblies has a first length and the row of permanent magnets has a second length, wherein the second length is smaller than the first length, and wherein the coil assemblies are arranged to interact with permanent magnets aligned with the coil assemblies to generate a driving force,
   a comparator to compare a position measurement signal representative for an actual position of the movable part with a set-point signal representative for a desired position of the movable part to provide an error signal;
   a motion feedback controller configured to provide a control signal on the basis of the error signal;
   at least one current amplifier configured to provide an actuation signal to the coil assemblies on the basis of the control signal,
   wherein the motor comprises a feedforward device, wherein the feedforward device is configured to provide a current amplifier feedforward signal on the basis of the set-point signal, or a derivative thereof, and wherein the current amplifier feedforward signal is provided to the at least one current amplifier to compensate for unbalanced back electromotive forces on one or more of the coil assemblies due to the one or more coil assemblies being only partly aligned with the permanent magnets; and
   a controller configured to calibrate and/or tune the feedforward device using an actual state of the coil assemblies.

2. The motor of claim 1, wherein the current feedforward signal is further used to compensate for load resistance, load self-inductance and/or load mutual inductance of the motor.

3. The motor of claim 1, wherein the motor is a linear motor, and wherein the row of coil assemblies and the row of permanent magnets are linear rows arranged substantially in parallel to each other.

4. The motor of claim 1,
   wherein the at least one current amplifier comprises:
      a current amplifier comparator to compare the control signal with an actual state of the current amplifier to provide a current amplifier error signal,
      a current amplifier feedback controller to provide a current amplifier control signal on the basis of the current amplifier error signal, and
      an amplifier to provide an actuation signal to the coil assemblies;

wherein the current amplifier feedforward signal is fed into the current amplifier and added to the current amplifier control signal of the current amplifier feedback controller.

5. The motor of claim 1, wherein the current amplifier is a voltage controlled current amplifier or a current controlled current amplifier.

6. The motor of claim 1, wherein the feedforward device is a multiple input-multiple output (MIMO) feedforward device.

7. The motor of claim 1, wherein the coil assemblies are multiple phase coil assemblies, wherein the motor comprises a current amplifier for each coil assembly, and wherein each current amplifier provides an actuation signal for each phase of the respective coil assembly.

8. The motor of claim 1,
wherein the stationary part comprises a second row of coil assemblies, extending in parallel to the row of coil assemblies,
wherein the movable part comprises a second row of permanent magnets, extending in parallel to the row of permanent magnets,
wherein the coil assemblies of the first row of coil assemblies are arranged to interact with permanent magnets of the first row of permanent magnets aligned with these coil assemblies to generate a driving force,
wherein the coil assemblies of the second row of coil assemblies are arranged to interact with permanent magnets of the second row of permanent magnets aligned with these coil assemblies to generate a driving force, and
wherein the row of permanent magnets and the second row of permanent magnets are arranged between the row of coil assemblies and the second row of coil assemblies.

9. The linear motor of claim 1, wherein the feedforward device also provides a motion feedforward signal to be added to the control signal of the motion feedback controller.

10. A dual stroke stage to support an object comprising a long stroke stage movably supported on a support frame and a short stroke stage movably supported on the long stroke stage, wherein the short stroke stage is arranged to support the object, and wherein the movable stage comprises a motor of claim 1, to drive the long stroke stage with respect to the support frame.

11. A lithographic apparatus comprising:
a patterning device support constructed to support a patterning device, the patterning device being capable of imparting the radiation beam with a pattern in its cross-section to form a patterned radiation beam;
a substrate support constructed to hold a substrate; and
a projection system configured to project the patterned radiation beam onto a target portion of the substrate;
wherein the patterning device support and/or the support comprises a dual stroke stage comprising:
a long stroke stage movably supported on a support frame, and
a short stroke stage movably supported on the long stroke stage,
wherein the short stroke stage is arranged to support the object, and wherein the movable stage comprises a motor of claim 1, to drive the long stroke stage with respect to the support frame.

12. A motor comprising:
a stationary part, comprising:
a first row of coil assemblies,
a second row of coil assemblies, wherein the coil assemblies of the first row and the second row are multiple phase coil assemblies, and
a movable part, comprising:
a first row of permanent magnets, and
a second row of permanent magnets, extending in parallel to the first row of permanent magnets,
wherein the first row of coil assemblies and the second row of coil assemblies each have a first length and wherein the first row of permanent magnets and the second row of permanent magnets each have a second length, wherein the second length is smaller than the first length, and wherein the coil assemblies are arranged to interact with permanent magnets aligned with the coil assemblies to generate a driving force,
wherein the first row of permanent magnets and the second row of permanent magnets are arranged between the first row of coil assemblies and the second row of coil assemblies,
wherein the first row of permanent magnets is mirrored with the second row of permanent magnets with respect to a mirror plane extending in parallel and between the first row of permanent magnets and the second row of permanent magnets, and
wherein an order of phases of each respective coil assembly of the first row of coil assemblies corresponds to an order of phases of a, with respect to the mirror plane, opposite coil assembly of the second row of coil assemblies,
such that when the respective coil assembly and the opposite coil assembly are driven with fixed and constant currents, edge effects in a direction perpendicular to the mirror plane are substantially cancelled.

13. The motor of claim 12, wherein the first row of coil assemblies has six coil assemblies and the second row of coil assemblies has six coil assemblies.

14. The motor of claim 12, wherein the first row of permanent magnets and the second row of permanent magnets extend over a length substantially corresponding with four coil assemblies of each of the first row of coil assemblies and the second row of coil assemblies.

15. The motor of claim 12, wherein the motor comprises:
a set point generator to provide a set-point signal representative for a desired position of the movable part;
a comparator to compare an actual position with the desired position to provide an error signal;
a motion feedback controller to provide control signal on the basis of the error signal; and
at least one current amplifier to provide an actuation signal to the coil assemblies on the basis of the control signal.

16. The motor of claim 15, wherein for each coil assembly a current amplifier is provided, and wherein the linear motor comprises a commutation and gain balancing device to provide individual current amplifier input signals to the respective current amplifier of each of the coil assemblies on the basis of the control signal.

17. The motor of claim 16, wherein the control signal comprises a required vertical actuation force and a required horizontal actuation force in a first horizontal direction, and wherein the commutation and gain balancing device is arranged to equally divide the required vertical actuation force and the required horizontal actuation force over all coil assemblies of the first row and the second row.

18. The motor of claim 12, wherein the coil assemblies of the first row and the second row are three phase coil assemblies.

19. The motor of claim 12, wherein the first row is an upper row and the second row is a lower row and wherein the second row of permanent magnets is arranged below the first row of permanent magnets.

* * * * *